United States Patent [19]

Suzuki

[11] Patent Number: 5,214,340
[45] Date of Patent: May 25, 1993

[54] DRIVER CIRCUIT FOR PIEZOELECTRIC ELEMENT, HAVING VOLTAGE LIMITER CAPABLE OF CHARGING THE ELEMENT WITH ENERGY FROM COIL AFTER CHARGING SWITCH IS OFF

[75] Inventor: Masashi Suzuki, Nagoya, Japan

[73] Assignee: Brother Kogyo Kabushiki Kaisha, Aichi, Japan

[21] Appl. No.: 771,225

[22] Filed: Oct. 4, 1991

[30] Foreign Application Priority Data

Oct. 9, 1990 [JP] Japan .................. 2-271646

[51] Int. Cl.$^5$ .................................. H01L 41/08
[52] U.S. Cl. ................... 310/316; 318/116; 310/317
[58] Field of Search ............. 310/316, 317, 323, 328; 318/116

[56] References Cited

U.S. PATENT DOCUMENTS

| | | | |
|---|---|---|---|
| 4,595,854 | 6/1986 | Yano et al. | 310/317 |
| 4,688,536 | 8/1987 | Mitsuyasu et al. | 310/317 X |
| 4,767,959 | 8/1988 | Sakakibara et al. | 310/317 |
| 4,947,074 | 8/1990 | Suzuki | 310/317 X |

FOREIGN PATENT DOCUMENTS 2198604A 6/1988 United Kingdom.

*Primary Examiner*—Mark O. Budd
*Attorney, Agent, or Firm*—Oliff & Berridge

[57] ABSTRACT

A driver circuit for a piezoelectric element having capacitance C, including a DC power source, a coil having inductance L, a voltage limiter, and a first and a second switching device for charging and discharging the element, respectively. The first switching device is held on for a time not shorter than $(\pi\sqrt{LC})/3$ and is turned off at a first point of time before a voltage of the piezoelectric element has reached a predetermined voltage not higher than a line voltage of the power source. The voltage limiter allows the element to be charged with an energy stored in the coil after the charging by the first switching device, and prevents the element from receiving an excessive energy that causes the voltage of the element to exceed the predetermined level. The second switching device is turned on at a point of time not earlier than the first point of time, and is turned off by the time when the first switching device is turned on for a next activation of the element.

9 Claims, 8 Drawing Sheets

DRIVER CIRCUIT FOR PIEZOELECTRIC ELEMENT, HAVING VOLTAGE LIMITER CAPABLE OF CHARGING THE ELEMENT WITH ENERGY FROM COIL AFTER CHARGING SWITCH IS OFF

BACKGROUND OF THE INVENTION

1. Field of the Invention

The present invention relates generally to a driver circuit for driving a piezoelectric element, and more particularly to such a driver circuit which is economical to manufacture and which requires reduced electric power consumption and generates reduced amount of heat.

2. Discussion of the Prior Art

A piezoelectric element oscillates at a given frequency, with alternate repetition of charging and discharging. In some applications of the piezoelectric element as an actuator, it is desirable that the piezoelectric element be held in the same displaced state for more than a predetermined time duration.

For example, the above desire exists when the piezoelectric element is used as an actuator for operating a print wire of a print head of a dot-matrix impact printer.

The present applicant et al have proposed a driver circuit for driving a piezoelectric element, as disclosed in co-pending application Ser. No. 07/426,773 filed Oct. 26, 1989. The driver circuit disclosed therein includes a charging circuit having a DC power source and a coil which are connected in series to the piezoelectric element for charging the piezoelectric element, and a discharging circuit for allowing the piezoelectric element to be discharged. The driver circuit comprises: (a) first conditioning means provided in the charging circuit, and having an original state for inhibiting the piezoelectric element from being charged, and a charging state for allowing the piezoelectric element to be charged, the first conditioning means being normally placed in the original state, and being brought into the charging state upon generation of a drive command to activate the piezoelectric element, the first conditioning means being returned to the original state at a first point of time a predetermined time after a voltage of the piezoelectric element has reached a predetermined level not higher than a line voltage of the power source; (b) second conditioning means provided in the discharging circuit, and having an original state for inhibiting the piezoelectric element from being discharged, and a discharging state for allowing the piezoelectric element to be discharged, the second conditioning means being normally placed in the original state, and being brought into the discharging state thereof at the first point of time indicated above, or at a second point of time a predetermined time after the first point, the second conditioning means being returned to the original state by the time when the first conditioning means is placed in the charging state for the next activation of the piezoelectric element; and (c) voltage limiting means for preventing the piezoelectric element from receiving an excessive electric energy that causes the voltage of the piezoelectric element to exceed the predetermined level indicated above, and thereby limiting the voltage of the element to the predetermined level.

In the driver circuit constructed as described above, the voltage limiting means (in the form of diodes, for example) permits an electric current to flow in a direction from the coil toward the power source after the voltage of the piezoelectric element has reached the predetermined level during charging of the element. Consequently, the electric energy is stored in the coil, preventing the voltage of the piezoelectric element from exceeding the line voltage of the power source, thereby maintaining the piezoelectric element at the predetermined level, after the predetermined level has been reached.

The application of the drive voltage to charge the piezoelectric element is started in response to the drive command, and continues for a suitable period, which expires when or after the voltage of the piezoelectric element has reached the predetermined level.

After the charging time has expired, the electric energy stored in the coil is returned to the DC power source for some period, during which the piezoelectric element cannot be discharged. In other words, the discharging of the piezoelectric element tends to be delayed, causing a relatively long time between the moment of termination of the current charging cycle and the moment of commencement of the next charging cycle. Consequently, the required cycle time including the charging and discharging times tends to be relatively long, causing an accordingly low operating speed of the piezoelectric actuator.

Another drawback of the driver circuit discussed above is a comparatively large amount of electric power consumption due to the electric current flow through the coil for the relatively long charging time with the drive voltage kept applied to the piezoelectric element until the voltage of the piezoelectric element has reached the predetermined level.

As a result of a continuing study in an effort to solve the above drawbacks, the applicant found that the voltage of the piezoelectric element will rise up to the line voltage of the DC power source, even if the application of the drive voltage is terminated before the voltage of the piezoelectric element has reached the predetermined level not higher than the line voltage.

SUMMARY OF THE INVENTION

It is therefore an object of the present invention to provide a driver circuit for driving a piezoelectric element, which does not suffer from the drawbacks as encountered on the conventional driver circuit discussed above.

The above object may be accomplished according to the principle of the present invention, which provides a driver circuit for driving a piezoelectric element having a capacitance C, including a DC power source, and a coil having an inductance L and connected in series with the piezoelectric element and the power source, the piezoelectric element being alternately charged and discharged while oscillating with the coil at a predetermined frequency, the driver circuit comprising: (a) first conditioning means for charging the piezoelectric element, the first conditioning means being normally placed in an original state for inhibiting the piezoelectric element from being charged, and brought to a charging state for allowing the piezoelectric element to be charged, in response to a drive command to activate the piezoelectric element, the first conditioning means being held in the charging state for a time period not shorter than $(\pi\sqrt{LC})/3$, and returned to the original state at a first point of time before a voltage of the piezoelectric element has reached a a predetermined level not higher than a line voltage of the power source; (b) voltage limiting means for allowing the piezoelectric element to be charged with an energy stored in the coil after the piezoelectric element has been charged by the first conditioning means, and preventing the piezoelectric element from receiving an excessive energy that causes the voltage of the piezoelectric element to exceed the predetermined level; and (c) second conditioning means for discharging the piezoelectric element, the second conditioning means being normally placed in an original state for inhibiting the piezoelectric element from being discharged, and brought to a discharging state for allowing the piezoelectric element to be discharged, at a second point of time not earlier than the first point of time, the second conditioning means being returned to the original state thereof by the time when the first conditioning means is placed in the charging state thereof for a next activation of the piezoelectric element.

In the driver circuit of the present invention constructed as described above, the piezoelectric element is first charged by the first conditioning means for a time period not shorter than $(\pi\sqrt{LC})/3$. This charging permits the voltage of the piezoelectric element to rise up to the predetermined level not higher than the line voltage of the power source, even though the time period of charging by the first conditioning means is shorter than $(\pi\sqrt{LC})/2$. More specifically, the charging by the first conditioning means causes an energy to be stored in the coil when the first conditioning means is turned off, and the voltage limiting means allows the piezoelectric element to be further charged with the energy stored in the coil after the piezoelectric element has been charged by the first conditioning means, whereby the voltage of the piezoelectric element is raised to the predetermined voltage of the power source.

Conventionally, the first conditioning means is held on or in the charging state at least until the voltage of the piezoelectric element has reached the line voltage, namely, for a time period not shorter than $(\pi\sqrt{LC})/2$. This conventional arrangement requires at least a time length $\sqrt{LC}$ for the electric current flow through the coil to be zeroed. Therefore, it is not allowed to start discharging the piezoelectric element, for at least a time length equal to $(1+\pi/2)\sqrt{LC}$ after the charging by the first conditioning means is started.

According to the present invention, however, the discharging of the piezoelectric element can be started earlier than in the conventional arrangement. If the charging time of the first conditioning means is $(\pi\sqrt{LC})/3$, the voltage of the piezoelectric element rises to the predetermined peak level equal to or slightly lower than the line voltage of the power source, at a point of time which is $(\pi\sqrt{LC}/3$ after the first conditioning means is turned off or returned to the original state. Accordingly, the discharging of the piezoelectric element by the second conditioning means can be started at a point of time which is $2(\pi\sqrt{LC})/3$ after the first conditioning means is turned on to start the charging of the piezoelectric element. This discharge inhibit period $2(\pi\sqrt{LC})/3$ is shorter than the discharge inhibit period $(1+\pi/2)\sqrt{LC}$ required in the conventional driver circuit.

Since the required time period between the commencement of charging of the piezoelectric element and the moment at which the commencement of the discharging is permitted is shortened as described above, the operating efficiency of an actuator which uses the piezoelectric element can be accordingly improved. If the piezoelectric element is used for actuating a print wire of a print head, the printing speed can be increased. Further, the reduction in the required time period between the charging and the discharging of the piezoelectric element makes it possible to reduce the electric energy consumed by the coil, resulting in effective energy saving of the piezoelectric actuator.

Theoretically, the second conditioning means for discharging the piezoelectric element is brought to the discharging state at a point of time not earlier than the moment at which the voltage of the piezoelectric element has been raised to predetermined level not higher than the line voltage of the power source by the voltage limiting means. Practically, however, the discharging of the piezoelectric element will not occur as long as the electric current is flowing from the coil into the piezoelectric element, that is, until the voltage of the piezoelectric element has reached the predetermined level. In this respect, the second conditioning means may be brought to the discharging state before the voltage of the piezoelectric element has reached the line voltage, provided that the second conditioning means is brought to the discharging state at a point of time not earlier than the moment at which the first conditioning means is returned to the original state (at which the charging by the first conditioning means is completed).

The first conditioning means may comprise first time measuring means for measuring a time period after the first conditioning means is brought to the charging state. The first conditioning means is returned to the original state when the time period measured by the first time measuring means has reached a first reference time period which defines the first point of time.

Similarly, the second conditioning means may comprise second time measuring means for measuring a second time period after the first conditioning means is brought to the charging state. The second conditioning means is returned to the original state when the time period measured by the second time measuring means has reached a second reference time period which defines the second point of time.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
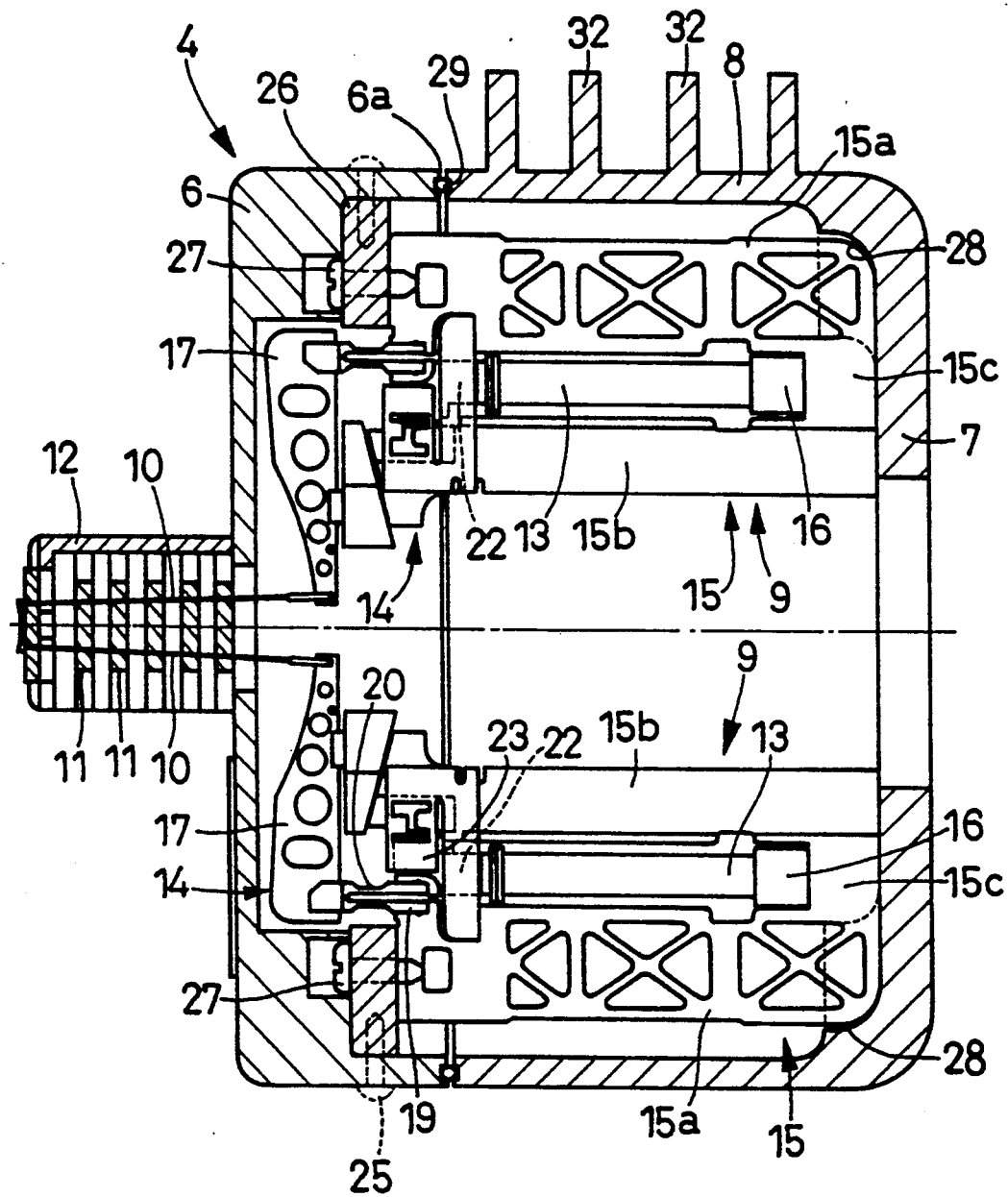
FIG. 1 is a side elevational view in cross section of a dot-matrix impact print head to which the present invention is applicable.
Figure 2:
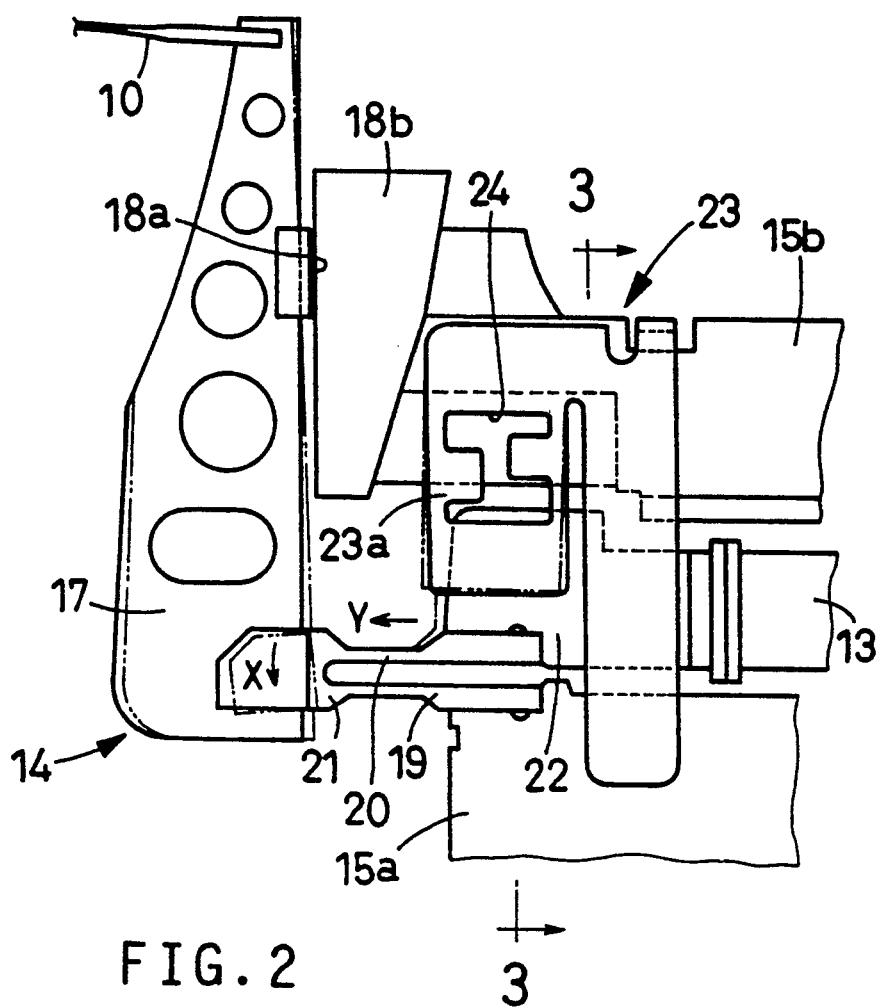
FIG. 2 is a fragmentary enlarged view of the print head of FIG. 1.
Figure 3:
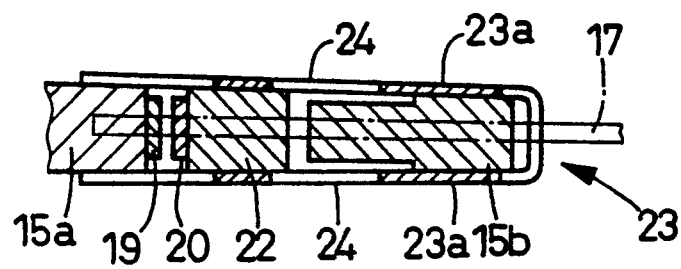
FIG. 3 is a cross sectional view taken along line 3—3 of FIG. 2.

Referring first to FIG. 1 through FIG. 3, there is shown a print head 4 used for a dot-matrix impact printer. The print head 4 has a housing body consisting of a generally disk-like front housing 6, and a rear housing having an annular rear wall 7 and a cylindrical wall 8 which extends from the periphery of the rear wall 7 toward the rear side of the front housing 6. The front and rear housings 6, 7, 8 are formed of an aluminum alloy and cooperate to define an enclosure having a cylindrical space.

In the cylindrical space of the housing body 6-8 of the print head 4, there are accommodated a plurality of piezoelectric actuator units 9, more precisely, 24 piezoelectric actuator units 9 such that the units 9 are arranged in spaced-apart relation with each other in the circumferential direction of the housing body 6-8. The front housing 6 has a hollow nose 12 secured to the front surface. The hollow nose 12 has a plurality of guide plates 11 for guiding print wires 10 which are driven by the respective actuator units 9. The print wires 10 extend through the front housing 6 and the nose 12, so that the free ends of the wires 10 are outside the nose 12 when the wires are moved to the operated position.

Each piezoelectric actuator unit 9 includes a piezoelectric member 13 having a laminar structure with its length parallel to the axial direction of the housing body 6-8. The piezoelectric member 13 consists of a multiplicity of piezoelectric elements P, which are superposed on each other in the direction of length of the member 13. The actuator unit 9 further includes a drive linkage 14 connected to the front end of the piezoelectric member 13. The drive linkage 14 functions to amplify the expanding and contracting movements of the piezoelectric member 13, and transmit the amplified movements to the corresponding print wire 10. The piezoelectric member 13 and the drive linkage 14 are supported by a support frame 15 which extends between the front housing 6 and the rear wall 7. The support frame 15 is a generally U-shaped one-piece member consisting of a main support 15a, an auxiliary support 15b, and a rear seat portion 15c, which are arranged such that the main and auxiliary supports 15a, 15b are disposed on the outer and inner sides of the piezoelectric member 13 as viewed in the radial direction of the print head 4, while the piezoelectric element 13 rests on the rear seat portion 15c which connects the two supports 15a, 15b.

The auxiliary support 15b may be a separate member secured by brazing to the rear seat portion 15c which is integral with the main support 15a.

In operation of the print head 4, the piezoelectric member 13 expands in the direction in which the piezoelectric elements P are superposed on each other, that is, in the longitudinal direction, upon application of a drive voltage to each of the piezoelectric elements P. When the drive voltage is removed from each piezoelectric element P, the piezoelectric member is contracted in the longitudinal direction.

It is noted that the piezoelectric member 13 has a certain amount of residual strain (in the form of expansion), which decreases with a rise in the temperature of the piezoelectric member, even if the voltage applied to the piezoelectric elements P is controlled to be constant. Consequently, the front end of the piezoelectric member 13 is not advanced to the nominal position corresponding to the nominal operated position of the print wire 10 when the piezoelectric member 13 is energized with the predetermined voltage. When the print wire 10 is moved to the nominal operated position (printing position), the operating end of the print wire 10 comes into abutting contact with a recording medium, thereby printing a dot on the medium. As the operating temperature of the piezoelectric member 13 increases, the distance of the front end of the energized piezoelectric member 13 with respect to the nominal position increases, thereby increasing the distance between the operating end of the print wire 10 and the nominal operated position. To deal with this drawback, there is disposed a temperature compensating member 16 between the rear end of the piezoelectric member 13 and the rear seat portion 15c of the support frame 15. The temperature compensating member 16 has a positive coefficient of thermal expansion so as to advance the piezoelectric member 13 as the temperature of the member 13 rises.

Each piezoelectric actuator unit 9 has a radial arm 17 which has a generally triangular shape as seen in FIGS. 1 and 2. The radial arm 17 has a distal end to which is fixed by brazing the proximal end of the print wire 10. The proximal end of the radial arm 17 is connected to the piezoelectric member 13 through a spring member 19-21 and a movable member 22. The spring member consists of a first and a second sheet spring 19, 20 extending parallel to the length of the main support 15a, and a connecting portion 21 which connects the first and second sheet springs 19, 20 at the front ends thereof. The proximal end of the print wire 10 fixly engages the connecting portion 21. The rear end portion of the first sheet spring 19 is secured by brazing to the side surface of the main support 15a, while the rear end portion of the second sheet spring 20 is secured by brazing to the side surface of the movable member 22, which in turn is secured by brazing to the front end face of the piezoelectric member 13.

When the movable member 22 is advanced in the direction indicated by arrow Y in FIG. 2 as a result of expansion or elongation of the laminar piezoelectric member 13 upon application of the drive voltage to the piezoelectric elements P, the connecting portion 21 of the spring 19-21 is rotated in the counterclockwise direction as indicated by arrow X in FIG. 2, whereby the radial arm 17 is pivoted in the same direction, so that the print wire 10 is advanced by a distance larger than the distance of displacement of the energized piezoelectric member 13. As a result, the operating end of the print wire 10 projects out of the hollow nose 12 of the print head 4.

When the drive voltage is removed from the piezoelectric member 13, the radial arm 17 is pivoted in the clockwise direction due to a resilient force of the sheet springs 19, 20, until an abutment 18a provided on the arm 17 abuts on a stop 18b provided on the support frame 15. The abutment and stop 18a, 18b are made of a resin material.

Reference numeral 23 in FIGS. 1-3 denotes a quadric link member which connects the auxiliary support 15b and the movable member 22. The quadric link member 23 is formed from an elastic member such as a spring sheet, such that the member 23 has a pair of opposed wide planar portions 23a, 23a each having an H-shaped cutout 24. The wide planar portions 23a are brazed to the opposite surfaces of the auxiliary support 15b and the corresponding opposite surfaces of the movable member 22. When the piezoelectric member 13 is displaced in the expanding and contracting directions upon application and removal of the voltage thereto, the link member 23 elastically deforms in the form of a parallelogram, thereby permitting the movable member 22 to move along the length of the stationary auxiliary support 15b, as indicated in two-dot chain line in FIG. 2.

Since the movable member 22 is guided to move in the longitudinal direction of the auxiliary support 15b, namely, guided to be translated in the longitudinal direction of the piezoelectric member 13, the piezoelectric member 13 is protected from a bending force which would act on the bonding interfaces of the piezoelectric elements P (piezoelectric ceramic layers) so as to cause flake-off or separation of the elements P from each other.

The main support 15a of the support frame 15 for each piezoelectric actuator unit 9 is fixed by screw 27 at its front end to the rear surface of an annular bracket 26, which is secured by screws 25 to the rear portion of the front housing 6. The support frame 15 is secured at its rear end to the annular inner surface of the rear wall 7, by bonding with an adhesive such as epoxy resin or other thermosetting resin or by brazing. The rear housing 7, 8 has fillets 28 formed at the periphery of the annular inner surface, as shown in FIG. 1, such that the fillets 28 are spaced apart from each other in the circumferential direction of the rear housing 7, 8, in aligned relation with the respective support frames 15. The fillets 28 function to position the rear end of each support frame 15 and increase the bonding surface between the frame and the rear housing 7, 8.

Thus, the rear housing 7, 8 which covers an array of the piezoelectric actuator units 9 is fixed to the front housing 4 via the support frames 15. A sealing member in the form of a ring made of a rubbery material, for example, is interposed between the annular front end face of the cylindrical wall 8 and the corresponding annular rear end face 6a of the front housing 6.

To improve the efficiency of external dissipation of heat generated by energization of the piezoelectric members 13, it is desirable to fill voids left between the front and rear housings 6-8 and the circumferential array of piezoelectric actuator units 9, with silicone rubber or other suitable filler material having high thermal conductivity, so that the heat is effectively conducted from the piezoelectric members 13 to the metallic components such as the support frames 15 and front and rear housings 6-8, for radiation of the heat into the ambient atmosphere. In this respect, it is preferable to provide the cylindrical wall 8 with fins 32 formed on its outer circumference, for improvement of the heat radiation efficiency.

Figure 4:
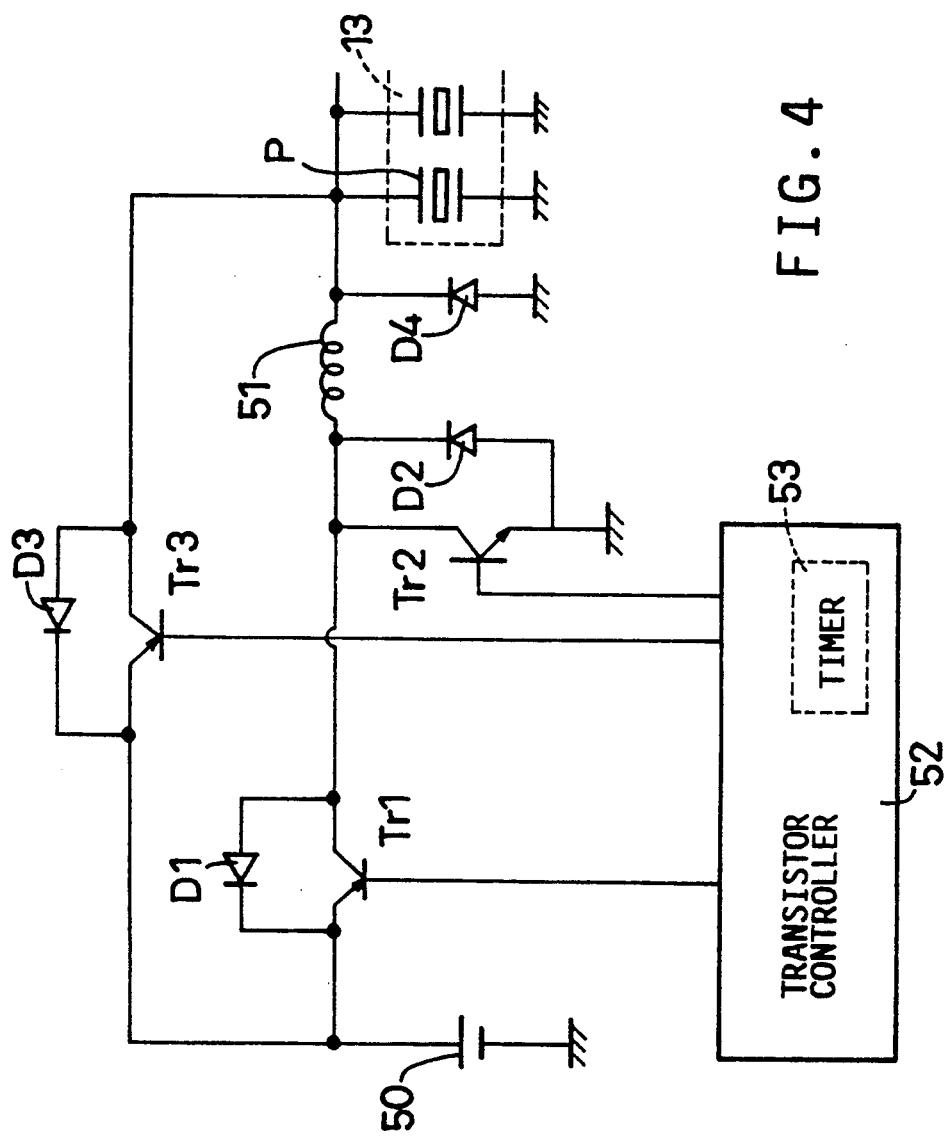
FIG. 4 is a diagram showing one embodiment of a driver circuit of the present invention for a piezoelectric actuator used for the print head of FIG. 1.

Referring next to FIG. 4, there is illustrated a driver circuit for driving each piezoelectric element P of the piezoelectric member 13 of each piezoelectric actuator unit 9 incorporated in the print head 4. The driver circuit includes a DC power source 50 having a line voltage E, a first transistor Tr1 and a coil 51, which are connected in series with each piezoelectric element P. The DC power source 50 is grounded at its negative terminal, and the piezoelectric element P is grounded at its negative electrode. When the first transistor Tr1 is turned ON, an electric current is allowed to flow through the transistor Tr1 in the direction from the positive terminal of the power source 50 toward the positive electrode of the piezoelectric element P. This direction will be referred to as "forward direction" when appropriate.

A second transistor Tr2 is connected between the first transistor Tr1 and the coil 51, and is grounded. This second transistor Tr2 allows an electric current to flow in its forward direction from the point of connection thereof to the first transistor Tr1 and coil 51, toward the ground.

A first diode D1 and a second diode D2 are provided in parallel connection with the first and second transistors Tr1 and Tr2, respectively, so that the first and second diodes D1, D2 by-pass the transistors Tr1, Tr2, respectively. The forward directions of these diodes D1, D2 are opposite to the forward directions of the respective transistors Tr1, Tr2.

A third transistor Tr3 is provided between the positive terminal of the DC power source 50 and the positive electrode of the piezoelectric element P, in parallel connection with the first transistor Tr1 and the coil 51. The forward direction of the third transistor Tr3 is from the positive terminal of the power source 50 toward the positive electrode of the piezoelectric element P. A third diode D3 is provided in parallel connection with the third transistor Tr3. The third diode D3 allows an electric current to flow in its forward direction which is opposite to the forward direction of the third transistor Tr3.

A fourth diode D4 is provided in parallel connection with the piezoelectric element P. The diode D4 allows an electric current to flow in its forward direction from the negative electrode toward the positive electrode of the piezoelectric element P.

The multiple piezoelectric elements P of each piezoelectric member 13 are connected in parallel with each other, as indicated in FIG. 4.

The first, second and third transistors Tr1, Tr2 and Tr3 are turned ON and OFF by a transistor controller 52. This controller 52 is provided by a microcomputer which also functions to control the entire operation of the dot-matrix impact printer using the print head 4. The transistor controller 52 incorporates a timer 53, which will be described.

Figure 5:
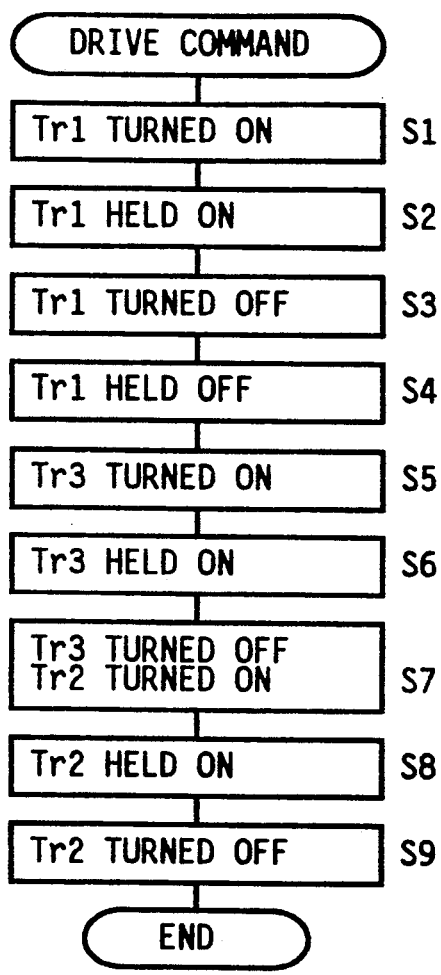
FIG. 5 is a flow chart illustrating an operation to control the driver circuit of FIG. 4.

Reference is now made to the flow chart of FIG. 5, which illustrates an operation of the transistor controller 52 to control each piezoelectric element P of the piezoelectric member 13 of a certain piezoelectric actuator unit 9, in response to a drive command to print a dot by the appropriate print wire 10. When the drive command is received by the transistor controller 52, the control flow goes to step S1 to turn ON the first transistor Tr1, whereby the transistor Tr1 permits an electric current to flow from the power source 50 into the piezoelectric element P through the coil 51. Consequently, the piezoelectric element P (equivalent to a capacitor as indicated at C in FIG. 6) is charged while it is oscillating together with the coil 51. Accordingly, the piezoelectric element P is elongated or displaced in the expanding direction, causing the print wire 10 to be advanced through the drive linkage 14, whereby the free end of the print wire 10 projects out of the nose 12 of the print head 4, and comes into abutting contact with the surface of a recording medium on a platen, via a print ribbon, as well known in the art.

Step S1 is followed by step S2 in which the transistor controller 52 holds the first transistor Tr1 in the ON position for a predetermined time period measured by the timer 53. As described below in detail, this charging time period is determined so that the piezoelectric element P can be charged to the line voltage of the power source 50 with an electric energy stored in the coil 51 when the first transistor Tr1 is turned OFF.

When the predetermined time period has passed, the transistor controller 52 executes step S3 to turn OFF the first transistor Tr1. Since the voltage of the piezoelectric element P has not reached the line voltage of the power source 50 by this time, the energy stored in the coil 51 is supplied to the piezoelectric element P through a closed path including the coil 51, piezoelectric element P and diode D2, whereby the voltage of the element P is raised to the line voltage.

Step S3 is followed by step S4 in which the transistor controller 52 holds the first transistor Tr1 in the OFF state for a predetermined time period necessary for the voltage of the piezoelectric element P to be raised to the line voltage with the energy supplied from the coil 51.

After the voltage across the piezoelectric element P has reached a level substantially equal to the line voltage E of the power source 50, an electric current will flow through the above-indicated closed path including the coil 51, third diode D3, power source 50, ground and second diode D2, since the diodes D3 and D2 allow the current flow in their forward direction after the voltage of the piezoelectric element P has reached the line voltage. Therefore, the voltage of the piezoelectric element P will not exceed the line voltage E.

Although the third diode D3 is adapted such that the voltage of the piezoelectric element P can reach a level almost equal to the line voltage E, the threshold value of the diode D3 may be determined so that the current will start flowing through the above-indicated closed path, when the voltage of the element P has reached a predetermined desired level not higher than the line voltage E.

If the voltage of the element P drops below the line voltage E due to a small amount of consumption of the energy by the element P, an electric energy will be supplied from the coil 51 to the element P, through the above-indicated closed path including the coil 51, element P, ground and second diode D2.

Then, the control flow goes to step S5 in which the transistor controller 52 turns ON the third transistor Tr3 Step S5 is followed by step S6 in which the transistor controller 52 holds the third transistor Tr3 in the ON state for a predetermined time period measured by the timer 53. This time period is determined so that during that time period the electric energy of the coil 51 can be consumed or returned to the power source 50, and so that the piezoelectric element P can be kept in the displaced or elongated state to hold the print wire 10 in the printing position for a suitable time.

If the energy of the element P is consumed after the amount of current flow through the coil 51 to the element P is zeroed, an electric energy is supplied from the power source 50 to the element P through the third transistor Tr3 which is held in the ON state. Thus, the voltage of the piezoelectric element P is held at the line voltage, and the element P is kept in the nominal displaced position.

The control flow then goes to step S7 in which the third transistor Tr3 is turned OFF, and the second transistor Tr2 is turned ON. Although the transistors Tr3 and Tr2 are turned OFF and ON, respectively, at the same time, it is desirable that the transistor Tr2 is turned ON a short time after the transistor Tr3 is turned OFF. Consequently, the electric energy stored in the piezoelectric element P will cause an electric current to flow through a closed path including the element P, coil 51, transistor Tr2, and ground. Since this closed path has substantially no electrically resistive component, there is substantially no thermal consumption of the energy of the element P, whereby the entire energy stored in the element P is stored as magnetic energy in the coil 51, a given time after the second transistor Tr2 is turned ON, as described later.

The second transistor Tr2 is held ON in step S8 for a suitable time period measured by the timer 53. This time period is determined so that the entire energy stored in the piezoelectric element P has been stored in the coil 51 during that time period. Then, the control flow goes to step S9 in which the transistor controller 52 turns OFF the second transistor Tr2, whereby the energy stored in the coil 51 causes an electric current to flow into the DC power source 50 through a closed path including the coil 51, first diode D1, power source 50, ground and fourth diode D4. As a result, the entire energy stored in the coil 51 is returned to the power source 50.

There will next be described the time period during which the first transistor Tr1 is held ON in step S2, according to the principle of the present invention.

Figure 6:
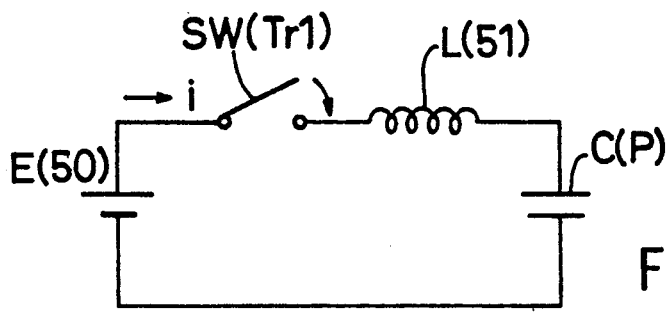
FIG. 6 is a view showing an equivalent circuit when a drive voltage is applied to a piezoelectric element of the piezoelectric actuator.

Referring to FIG. 6, there is formed a closed path including the DC power source 50, first transistor Tr1 as a switching element SW, coil 51 and piezoelectric element P as a capacitor, when the switch SW is closed with the first transistor Tr1 turned ON at time t=0. In an equivalent circuit of this closed path illustrated in FIG. 6, it is assumed that the circuit has no electrically resistive component and that the power source 50, coil 51 and piezoelectric element P have line voltage E, inductance L and conductance C (capacitance), respectively.

Assuming that the electric current which flows through the above-indicated closed path as a result of the closure of the switch SW at time t=0 is represented by i(t), the following equation (1) is established according to the Kirchhoff's second law:

$$E = L \frac{d}{dt} i(t) + \frac{1}{C} \int i(t)dt = 0 \tag{1}$$

If the electric charge of the piezoelectric element P is represented by q(t), the following equations are established:

$$q(t) = \int i(t)dt \quad i(t) = \frac{d}{dt} q(t)$$

According to these equations, the equation (1) is converted into the following differential equation (2):

$$E = L \frac{d^2}{dt^2} q(t) + \frac{1}{C} q(t) \quad (2)$$

The value q(t) is obtained by solving the above differential equation (2), in the following manner:

Initially, the transient term is obtained by solving the following equation (3), where E=0 in the above equation (2):

$$L \frac{d^2}{dt^2} q(t) + \frac{1}{C} q(t) = 0 \quad (3)$$

By substituting p for d/dt in the above equation the following characteristic equation (4) is obtained:

$$Lp^2 + 1/C = 0 \quad (4)$$

Therefore, the following equation is obtained: $p = \pm j/(\sqrt{LC})$, where j is an imaginary unit.

If the transient term is represented by $q_t(t)$, the following equation (5) is obtained:

$$q_t(t) = A_1 \exp\left(j \frac{1}{\sqrt{LC}} t\right) + A_2 \exp\left(-j \frac{1}{\sqrt{LC}} t\right) \quad (5)$$

The above equation (5) is converted into the following equation (6):

$$q_t(t) = (A_1 + A_2)\cos\left(\frac{1}{\sqrt{LC}} t\right) + j(A_1 - A_2)\sin\left(\frac{1}{\sqrt{LC}} t\right)$$

If the values A, B and $\omega_o$ represented by the following equations (6), the above equation (5) is converted into the following equation (7):

$$\left.\begin{array}{l} A = (A_1 + A_2) \\ B = j(A_1 - A_2) \\ \omega_0 = 1/\sqrt{LC} \end{array}\right\} \quad (6)$$

$$q_t(t) = A\cos\omega_0 t + B\sin\omega_0 t \quad (7)$$

On the other hand, the steady term of the equation (2) is expressed as $q_s = CE$, whereby q(t) is obtained from the following equation (8):

$$q(t) = q_s + q_t(t) = CE + A\cos\omega_o t + B\sin\omega_o t \quad (8)$$

Therefore, $$\text{Therefore, } i(t) = \frac{d}{dt} q(t) \qquad (9)$$
$$= \omega_0(B\cos\omega_o t - A\sin\omega_o t)$$

Then, the initial condition of the driver circuit is considered. At the time t=0, the electric charge of the piezoelectric element P is zero, and the electric current flowing through the closed path of the equivalent circuit of FIG. 6 is zero. Namely, q(0)=0, and i(0)=0, whereby the following equations are established from the above equations (8) and (9):

$$0 = CE + A \qquad 0 = \omega_0 B$$
$$A = -CE \qquad B = 0$$

Accordingly, the equations (8) and (9) are converted to the following equations (10) and (11), respectively:

$$q(t) = CE(1 - \cos\omega_0 t) \quad (10)$$

$$i(t) = CE\sin\omega_0 t \quad (11)$$

Since the line voltage of the power source 50 and the voltage across the piezoelectric element P are represented by E and $V_c(t)$, respectively, the following equation (12) is obtained:

$$V_c(t) = \frac{1}{C} q(t) = E(1 - \cos\omega_0 t) \quad (12)$$

The time t when the voltage $V_c(t)$ of the piezoelectric element P rises to the line voltage E is expressed by $\omega_0 t$ which satisfies the equation $1 - \cos\omega_0 t = 1$, and is therefore expressed by the following equation (13):

$$t\bigg|_{V_c(t) = E} = \frac{\pi}{2} \cdot \frac{1}{\omega_0} = \frac{\pi}{2} \cdot \sqrt{LC} \quad (13)$$

Figure 7:
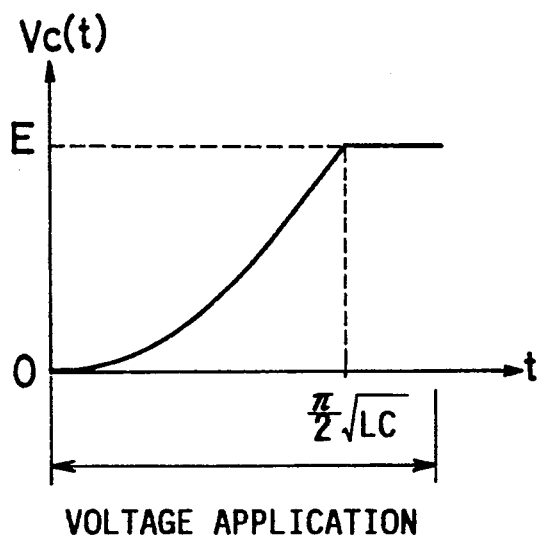
FIG. 7 is a graph showing a change in the voltage of the piezoelectric element while the element is charged.

Therefore, it will be understood that the voltage $V_c(t)$ of the piezoelectric element P will rise up to the line voltage E as indicated by a curve in FIG. 7, by holding the first transistor Tr1 in the ON state for a time not shorter than the period represented by $(\pi\sqrt{LC})/2$.

The electric current which flows through the coil 51 when at the end of the above-indicated period is represented by the following equation (14):

$$i(t)\bigg|_{t = (\pi\sqrt{LC})/2} = \omega_0 CE \quad (14)$$

Figure 8:
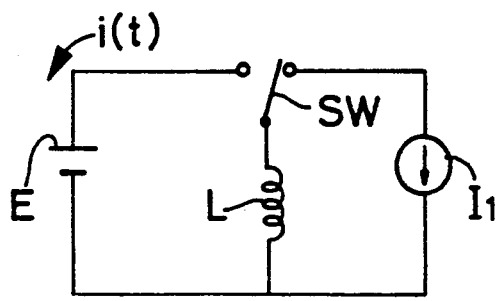
FIG. 8 is a view showing an equivalent circuit after the application of the drive voltage is terminated.

Since the electric current represented by the equation (14) is flowing through the coil 51 when the transistor Tr1 is turned OFF, an electric energy due to this current flow through the coil 51 is returned to the DC power source 50, as indicated by an equivalent circuit shown in FIG. 8, in which $I_1$ represents the current source while the arrow indicates the direction of flow of the current i(t).

$$I_1 = i(t)\bigg|_{t = (\pi\sqrt{LC})/2} = \omega_0 CE \quad (14')$$

If the transistor Tr1 is turned OFF at, time $t = t_1$ (FIG. 9) after a predetermined period of application of the line voltage E to the piezoelectric element P, the switch SW is switched from the side of the current source $I_1$ to the side of the power source E. As a result, the following equation (15) is established after time $t_1$, according to the Kirchhoff's second law:

$$E = -L \frac{d}{dt} i(t) \quad (15)$$

The above equation (15) is converted to the following differential equation:

$$\frac{d}{dt} i(t) = -E/L \quad (15)$$

By solving the above differential equation, the following equation (16) is obtained:

$$i(t) = (-E/L) \cdot t + K \quad (16)$$

where, K is an integration constant.

Since the equation $i(t_1) = \omega_0 CE$ is initially satisfied, the following equation is obtained by substituting $\omega_0 CE$ for $i(t)$ in the above equation (16):

$$\omega_0 CE = (-E/L) \cdot t_1 + K \therefore K = \omega_0 CE + (E/L) \cdot t_1$$

By substituting the thus obtained constant K for the constant K in the equation (16), the following equation (17) is obtained:

$$i(t) = (-E/L)(t - t_1) + \omega_0 CE \quad (17)$$

Therefore, the electric current i(t) represented by the equation (17) flows into the DC power source 50 when the transistor Tr1 is turned OFF at time $t = t_1$.

The time t when the current i(t) is zeroed, namely, the time period between the time $t_1$ and the time t is represented by the following equation:

$$t \bigg|_{i(t) = 0} = \omega_0 LC + t_1 = \sqrt{LC} + t_1$$

Hence, it will be understood that a time period of $\sqrt{LC}$ is required after the transistor Tr1 is turned OFF, so that the entire energy of the coil 51 is returned to the power source 50.

Figure 9:
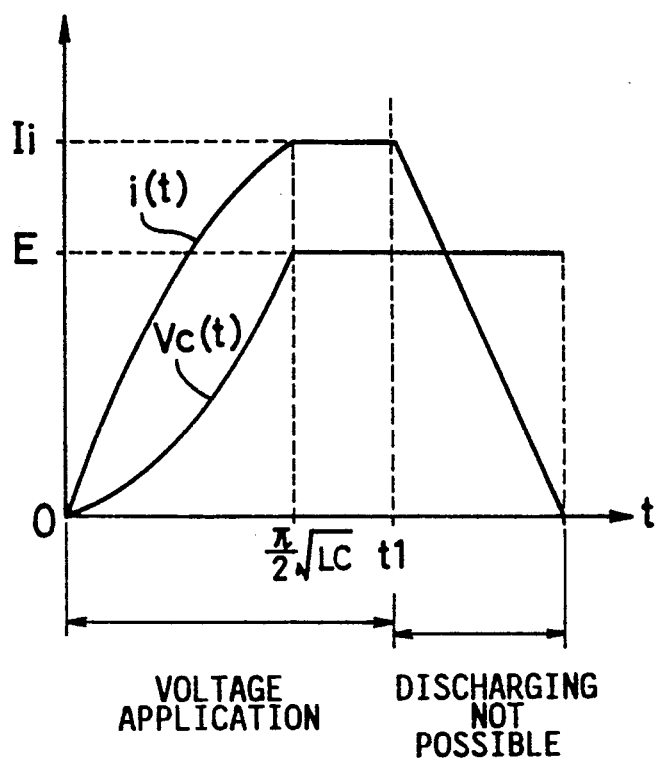
FIG. 9 is a graph showing changes in the voltage and current of the piezoelectric element in the equivalent circuit of FIG. 8.

When the piezoelectric element P is discharged with the second transistor Tr2 turned OFF, the electric current will flow through the coil 51 in the forward direction of the transistor Tr2. This forward direction is opposite to the direction in which the current flows into the power source 50 through the coil 51 and the second diode D2, during the time period of $\sqrt{LC}$. This means that during the time period of $\sqrt{LC}$, it is not impossible to discharge the piezoelectric element P with the transistor Tr2 turned OFF. The current i(t) and voltage $V_c(t)$ are indicated in the graph of FIG. 9.

Figure 11:
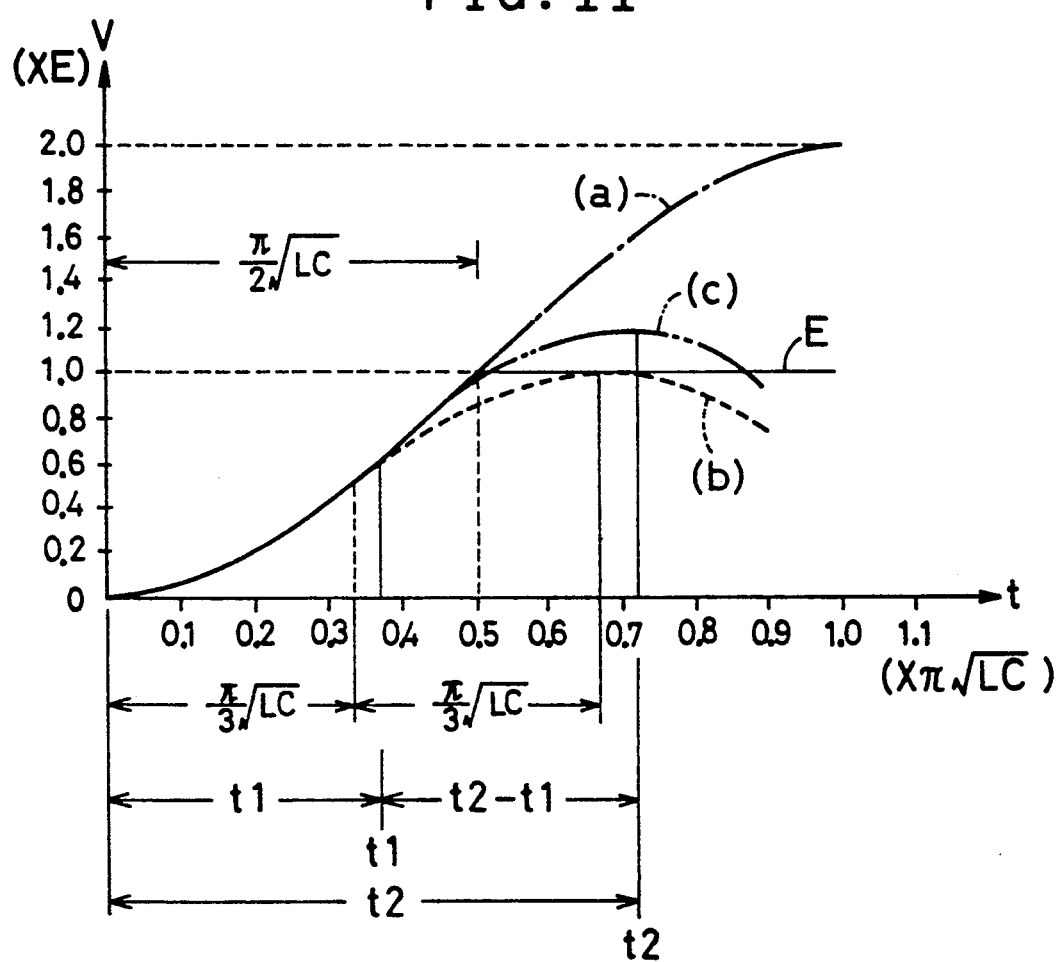
FIG. 11 is a graph showing changes in the voltage of the piezoelectric element.

There will next be described the case where the first transistor Tr1 is turned OFF at time $t_1$ which is prior to the end of the time period $(\pi\sqrt{LC})/2$, as indicated in FIG. 11.

At the time $t_1$ prior to the end of the time period $(\pi\sqrt{LC})/2$, the current i flowing through the closed path including the transistor Tr1, coil 51 and piezoelectric element P, and the voltage V of the capacitor (element P) are represented by the following equations (18) and (19), respectively:

$$i_1 = i(t) \bigg|_{t = t_1 -} = \omega_0 CE \sin \omega_0 t_1 \quad (18)$$

$$V_{c1} = V_c(t) \bigg|_{t = t_1 -} = E(1 - \cos \omega_0 t_1) \quad (19)$$

Figure 10:
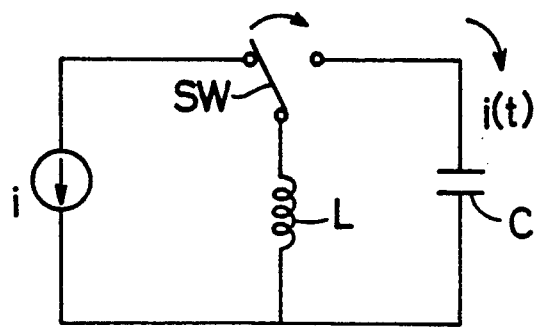
FIG. 10 is a view showing an equivalent circuit for explaining a voltage application time for charging the piezoelectric element.

The above-indicated closed path (including the transistor Tr1 as the switching element SW, coil 51, and piezoelectric element P as the capacitor) is indicated in the equivalent circuit of FIG. 10. It is assumed that the circuit has no electrically resistive component and that the coil 51 and the piezoelectric element P have inductance L and conductance C (capacitance), respectively.

Suppose the switch SW is switched from the side of the power source to the side of the capacitor (element P) at time $t = t_1$, the following equation (20) similar to the equation (1) is obtained according to the Kirchhoff's second law:

$$0 = L \frac{d}{dt} i(t - t_1) + \frac{1}{C} \int (t - t_1) dt \quad (20)$$

In this condition, the electric charge $q(t - t_1)$ of the piezoelectric element P, and the current $i(t - t_1)$ are represented by the following equations:

$$q(t - t_1) = \int i(t - t_1) dt$$

$$i(t - t_1) = \frac{d}{dt} q(t - t_1)$$

According to the above two equations, the equation (20) is converted to the following equation (21):

$$0 = L \frac{d^2}{dt^2} q(t - t_1) + \frac{1}{C} q(t - t_1) \quad (21)$$

The above equation (21) is similar to the equation (3) previously indicated. The following equations (22) and (23) are obtained in the manner as described with respect to the equation (3):

$$q(t - t_1) = A \cos \omega_0 (t - t_1) + B \sin \omega_0 (t - t_1) \quad (22)$$

$$i(t - t_1) = \omega_0 \{B \cos \omega_0 (t - t_1) - A \sin \omega_0 (t - t_1)\} \quad (23)$$

The initial electric charge $q(t - t_1)$ at time $t = t_1$ is represented by the following equation:

$$q(t - t_1) \bigg|_{t = t_1} = CV_{c1} = CE(1 - \cos \omega_0 t_1)$$

According to the above equation, the following equations (24) and (25) are obtained:

$$CE(1 - \cos \omega_0 t_1) = A \quad (24)$$

$$\omega_0 CE \sin \omega_0 t_1 = \omega_0 B \quad (25)$$

According to the equation (25), the following equation (25') is obtained:

$$B = CE \sin \omega_0 t_1 \quad (25')$$

By substituting the above equations (24) and (25') for the values A and B in the equations (22) and (23), the following equations (26) and (27) are obtained:

$$q(t-t_1) = CE(1-\cos\omega_0 t_1)\cos\omega_0(t-t_1) + CE\sin\omega_0 t_1 \cdot \sin\omega_0(t-t_1) \quad (26)$$

$$i(t-t_1) = \omega_0 CE\sin\omega_0 t_1 \cdot \cos\omega_0(t-t_1) - CE(1-\cos\omega_0 t_1))\sin\omega_0(t-t_1) \quad (27)$$

The voltage $V_c(t-t_1)$ across the capacitor (piezoelectric element P) is represented by the following equation (28):

$$V_c(t-t_1) = \frac{1}{C} q(t-t_1) \quad (28)$$

By substituting the above equation (26) for the value $q(t-t_1)$ in the equation (28), the following equation (29) is obtained:

$$V_c(t-t_1) = E(1-\cos\omega_0 t_1)\cos\omega_0(t-t_1) + E\sin\omega_0 t_1 \cdot \sin\omega_0(t-t_1) \quad (29)$$

Suppose the voltage $V_c(t-t_1)$ of the capacitor (element P) is maximum at time $t=t_2$ (FIG. 11), the time $t_2$ (time period t2 in FIG. 11) is obtained by solving the following equation (30), since it is equal to the root of the equation (29) when it is once differentiated:

$$\sin\omega_0 t_1 \cdot \cos\omega_0(t_2-t_1) - (1-\cos\omega_0 t_1)\sin\omega_0(t_2-t_1) = 0 \quad (30)$$

The left member of the above equation (30) is converted to obtained the following equation (21):

$$2\cos\omega_0(t_2 - \tfrac{1}{2}\cdot t_1)\cdot \sin\tfrac{1}{2}\omega_0 t_1 = 0 \quad (31)$$

Since the time $t_1$ is prior to the end of the time period $(\pi\sqrt{LC})/2$, as stated above, the following inequality is established:

$$0 < \omega_0 t_1 < \pi/2$$

Since $\sin\tfrac{1}{2}\omega_0 t_1 \neq 0$, the above equation (31) is converted to $\cos\omega_0(t_2 - \tfrac{1}{2}\cdot t_1) = 0$, and the following equation (32) is obtained:

$$\omega_0(t_2 - \tfrac{1}{2}\cdot t_1) = \pi/2 \quad (32)$$

The above equation (32) is converted to the following equation:

$$t_2 = (\tfrac{1}{2}\cdot t_1 + \pi/2)$$

Then, the time $t_1$ at which the first transistor Tr1 is turned OFF, i.e., the time duration t1 (in FIG. 11) during which the transistor Tr1 is held ON, is determined such that the voltage $V_c(t-t_1)$ of the capacitor (piezoelectric element P) is equal to the line voltage E at the time $t_2$ which is determined as explained above.

$$V_c(t-t_1)\bigg|_{t=t_2} = E \quad (33)$$

The left member of the above equation (33) is obtained by substituting $t_2$ for t in the above equation (29). The equation (29) is converted to the following equation:

$$\begin{aligned}V_c(t_2-t_1) &= E(1-\cos\omega_0 t_1)\cos\omega_0(t_2-t_1) + E\sin\omega_0 t_1 \cdot \sin\omega_0(t_2-t_1) \\ &= E\cos\omega_0(t_2-t_1) - E\cos\omega_0 t_2 \\ &= 2E\sin 1/2 \cdot \omega_0 t_1\end{aligned}$$

By substituting the above equation for the left member of the equation (33), the following equation is obtained:

$$2E\sin\tfrac{1}{2}\cdot\omega_0 t_1 = E$$

The above equation is converted to $\sin\tfrac{1}{2}\cdot\omega_0 t_1 = \tfrac{1}{2}$, which is solved as $\tfrac{1}{2}\cdot\omega_0 t_1 = \pi/6$. According to the equation (6), $\omega_0 = 1/\sqrt{LC}$. Therefore, the time $t_1$ in question is obtained from the following equation (34):

$$t_1 = (\pi\sqrt{LC})/3 \quad (34)$$

It will be understood from the foregoing explanation that the voltage of the piezoelectric element P rises up to the line voltage E if the time period t1 is set to be $(\pi\sqrt{LC})/3$ or longer. This lower limit $(\pi\sqrt{LC})/3$ of the time period t1 is considerably shorter than the time period $(\pi\sqrt{LC})/2$.

Where $(\pi\sqrt{LC})/3 \leq t_1 < (\pi\sqrt{LC})/2$, the voltage of the piezoelectric element P has not yet reached the line voltage E at the time $t_1$ when the first transistor Tr1 is turned OFF. Accordingly, the third transistor Tr3 should not be turned ON until the voltage of the element P has reached the line voltage E at the time $t_2$, that is, during the time period (t2−t1). The time $t_2$ is represented by the following equation (35):

$$\begin{aligned}t_2 &= 1/2 \cdot t_1 + \pi/2\omega_0 \\ &= 1/2 \cdot t_1 + (\pi\sqrt{LC})/2\end{aligned} \quad (35)$$

In the case where the time period t1 is the shortest, i.e., equal to $(\pi\sqrt{LC})/3$, the time period (t2−t1) is obtained as follows, according to the above equation (35):

$$t_2 - t_1 = \tfrac{1}{2}\cdot t_1 + \pi/2\omega_0 - t_1$$

The above equation is converted to the following equation (36):

$$t_2 - t_1 = (\pi\sqrt{LC})/2 - 1/2\cdot(\pi\sqrt{LC})/3 = (\pi\sqrt{LC})/3 \quad (36)$$

Thus, where the time period t1 is equal to $(\pi\sqrt{LC})/3$, second transistor Tr2 shown in FIG. 4 should be held OFF for the time period of $(\pi\sqrt{LC})/3$ even after the first transistor Tr1 is turned OFF at $t_1$.

The graph of FIG. 11 shows changes in the voltage $V_c(t)$ of the piezoelectric element P in three different cases indicated at (a), (b) and (c). In this graph, the voltage is taken along the vertical axis (ordinate) while the time t is taken along the horizontal axis (abscissa). The line voltage E of the power source 50 is set at 1.0, and the unit time span 1.0 is equal to $(\pi\sqrt{LC})$. One-dot chain line (a) indicates the change in the voltage $V_c(t)$ where the time period t1 is equal to $(\pi\sqrt{LC})/2$. A dashed line (b) indicates the change in the voltage $V_c(t)$ where the time period t1 is equal to the lower limit $(\pi\sqrt{LC})/3$ determined according to the principle of the present invention. A two-dot chain line (c) indicates the change in the voltage $V_c(t)$ where the time period t1 is longer than $(\pi\sqrt{LC})/3$ but shorter than $(\pi\sqrt{LC})/2$. According to the embodiment of FIG. 4, however, the voltage will not exceed the line voltage E, owing to the function of the presence of the diodes D3 and D2, even in the cases (a) and (c).

Figure 12:
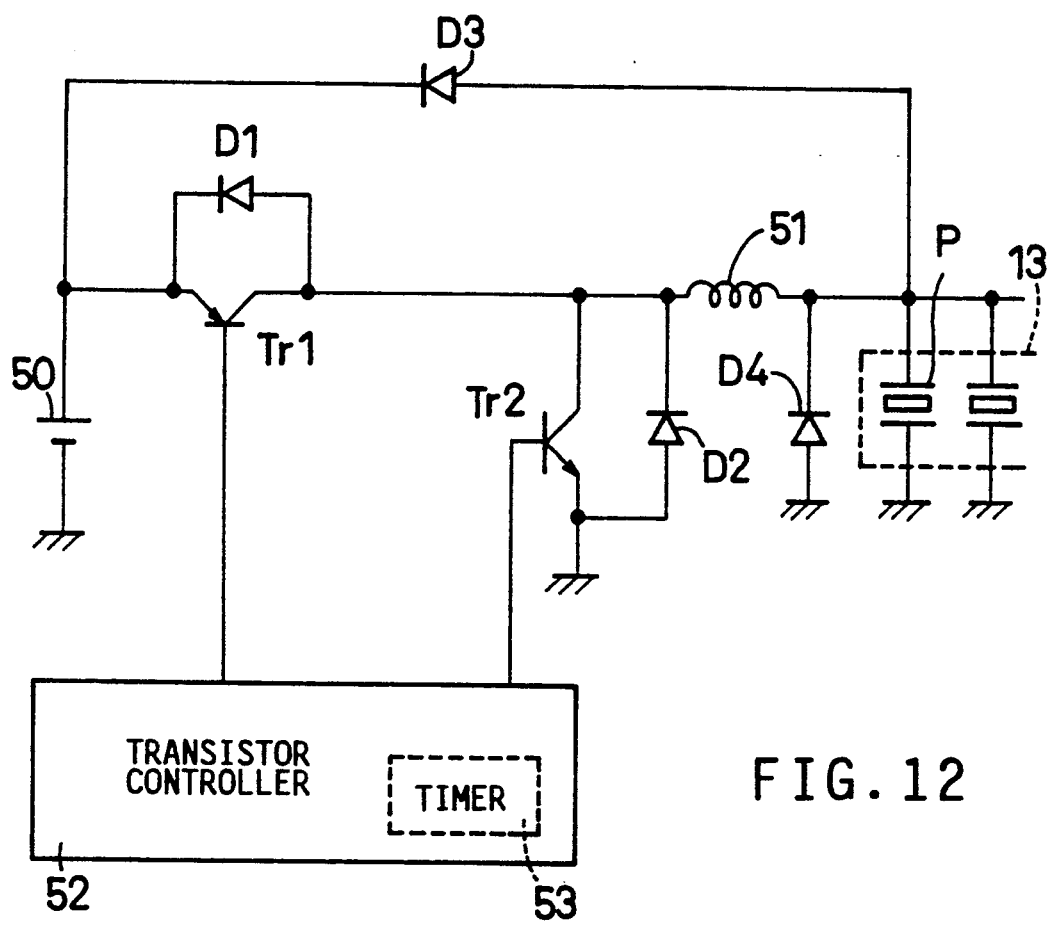
FIG. 12 is a diagram showing another embodiment of the driver circuit of the present invention.

Referring to FIG. 12, there is shown a modified embodiment of the driver circuit of the present invention, which does not have the third transistor Tr3 provided in the embodiment of FIG. 4. In this modified embodiment, too, the piezoelectric element P is charged to the line voltage with an energy supplied from the coil 51 after the the first transistor Tr3 is turned OFF. However, the voltage of the piezoelectric element P will not exceed the line voltage E, as described above with respect to the first embodiment. If the energy of the piezoelectric element P is consumed due to the abutting contact of the print wire 10 against the recording medium, the energy is supplied from the coil 51 to the element P through the closed path including the coil 51, piezoelectric element P and second diode D2. Thus, the voltage of the element P is maintained at the constant level E.

In the present embodiment of FIG. 12 which does not have the third transistor Tr3, an energy is not supplied from the power source 50 to the element P even when the energy of the element P is consumed after the amount of the electric current flowing through the coil 51 is zeroed. Accordingly, the voltage is lowered as the energy is consumed by the element P.

After the energy of the coil 51 is completely zeroed, or a predetermined time thereafter, the second transistor Tr2 is turned ON to discharge the element P through the second transistor Tr2. When the voltage of the element P is zeroed, or a predetermined time thereafter, the second transistor Tr2 is turned OFF, for the next energization of the element P with the first transistor Tr1 turned ON in the next cycle.

While the present invention has been described in its presently preferred embodiments, it is to be understood that the invention is not limited to the details of the illustrated embodiments, but may be embodied with various changes, modifications and advantages, which may occur to those skilled in the art, without departing from the spirit and scope of the invention defined in the following claims.

What is claimed is:

1. A driver circuit for driving a piezoelectric element having a capacitance C, including a DC power source, and a coil having an inductance L and connected in series with said piezoelectric element and said power source, said piezoelectric element being alternately charged and discharged while oscillating with said coil at a predetermined frequency, said driver circuit comprising:

first conditioning means for charging said piezoelectric element, said first conditioning means being normally placed in an original state for inhibiting said piezoelectric element from being charged, and brought to a charging state for allowing said piezoelectric element to be charged, in response to a drive command to activate said piezoelectric element, said first conditioning means being held in said charging state for a time period not shorter than $(\pi\sqrt{LC})/3$, and returned to said original state at a first point of time before a voltage of said piezoelectric element has reached a predetermined level not higher than a line voltage of said power source;

voltage limiting means for allowing said piezoelectric element to be charged with an energy stored in said coil after said piezoelectric element has been charged by said first conditioning means, and preventing said piezoelectric element from receiving an excessive energy that causes said voltage of the piezoelectric element to exceed said predetermined level; and second conditioning means for discharging said piezoelectric element, said second conditioning means being normally placed in an original state for inhibiting said piezoelectric element from being discharged, and brought to a discharging state for allowing said piezoelectric element to be discharged, at a second point of time not earlier than said first point of time, said second conditioning means being returned to said original state thereof by the time when said first conditioning means is placed in said charging state thereof for a next activation of said piezoelectric element.

2. A driver circuit according to claim 1, wherein said first conditioning means comprises time measuring means for measuring a time period after said first conditioning means is brought to said charging state, and returning said first conditioning means to said original state when the time period measured by said first time measuring means has reached a first reference time period which defines said first point of time.

3. A driver circuit according to claim 1, wherein said second conditioning means comprises time measuring means for measuring a second time period after said first conditioning means is brought to said charging state, and returning said second conditioning means to said original state when the time period measured by said time measuring means has reached a second reference time period which defines said second point of time.

4. A driver circuit according to claim 1, wherein the drive circuit includes a charging circuit incorporating a series connection of said DC power source, said coil and said piezoelectric element, and a discharging circuit having a closed path which includes said piezoelectric element and excludes said DC power source.

5. A driver circuit for driving a piezoelectric element having a capacitance C, including a DC power source, and a coil having an inductance L and connected in series with said piezoelectric element and said power source, said piezoelectric element being alternately charged and discharged while oscillating with said coil at a predetermined frequency, said driver circuit comprising a charging circuit incorporating a series connection of said DC power, said coil and said piezoelectric element, and a discharging circuit having a closed path which includes said piezoelectric element and excludes said DC power source, said driver circuit comprising:

first conditioning means for charging said piezoelectric element, said first conditioning means comprising first switching means connected in series with and between said coil and a positive terminal of said DC power source of said charging circuit, and first switching means for normally placing said first switching means in an original state for inhibiting said piezoelectric element from being charged, and for bringing said first switching means to a charging state for allowing said piezoelectric element to be charged, in response to a drive command to activate said piezoelectric element, said first switching means holding said first switching means in said charging state for a time period not shorter than $(\pi\sqrt{LC})/3$, and returning said first switching means to said original state at a first point of time before a voltage of said piezoelectric element has reached a predetermined level not higher than a line voltage of said DC power source;

voltage limiting means for allowing said piezoelectric element to be charged with an energy stored in said coil after said piezoelectric element has been charged by said first switching means, and preventing said piezoelectric element from receiving an excessive energy that causes said voltage of the piezoelectric element to exceed said predetermined level, said voltage limiting means comprising a closed by-pass circuit which by-passes said first switching means and which includes said DC power source, said coil, and first checking means connected in series to said power source and said coil, said checking means allowing a flow of an electric current in a direction from said coil toward said positive terminal of said power source, and inhibiting a flow of electric current in a direction from said positive terminal of said power source toward said coil; and second conditioning means for discharging said piezoelectric element, said second conditioning means comprising second switching means provided in said discharging circuit such that said second switching means is connected in series with said piezoelectric element, and further comprising second switching control means for normally placing said second switching means in an original state for inhibiting said piezoelectric element from being discharged, and bringing said second switching means to a discharging state for allowing said piezoelectric element to be discharged, at a second point of time not earlier than said first point of time, said second switching control means returning said second switching means to said original state by the time when said first switching means is placed in said charging state for a next activation of said piezoelectric element.

6. A driver circuit according to claim 5, further comprising third switching means connected in parallel with a series connection of said first switching means and said coil, and third switching control means for turning on said third switching means at a third point of time not earlier than a moment of completion of charging of said piezoelectric element by said voltage limiting means.

7. A driver circuit according to claim 5, wherein said discharging circuit includes said coil in series connection with said piezoelectric element, said driver circuit further comprising:

second checking means which is connected in parallel with said first switching means and which allows a flow of an electric current in a direction from said coil toward said positive terminal of said power source and inhibiting a flow of the electric current in a direction from said positive terminal of said power source toward said coil; and third checking means which is connected in series with and between a negative terminal of said power source and an end of said coil connected to said piezoelectric element and which allows a flow of an electric current in a direction from said negative terminal of said power source toward said end of said coil and inhibits a flow of the current in a direction from said end of said coil toward said negative terminal of said power source;

said coil, said power source, said second checking means and said third checking means constituting a closed energy returning circuit for returning an energy stored in said coil to said power source after said second switching means is turned off.

8. A driver circuit according to claim 5, wherein said first switching means and said second switching means comprise a first and a second transistor, respectively, and said first switching control means and said second switching control means are constituted by a computer.

9. A driver circuit according to claim 5, wherein said first checking means comprises a diode connected in series with and between a negative terminal of said DC power source and said coil, and another diode connected in series with and between said coil and said positive terminal of said power source.

* * * * *